United States Patent [19]
Bakhit et al.

[11] Patent Number: 5,151,388
[45] Date of Patent: Sep. 29, 1992

[54] FLIP INTERCONNECT

[75] Inventors: Gabriel G. Bakhit, Huntington Beach; Kevin P. Shambrook, Laguna Beach, both of Calif.

[73] Assignee: Hughes Aircraft Company, Los Angeles, Calif.

[21] Appl. No.: 697,350

[22] Filed: May 7, 1991

[51] Int. Cl.$^5$ ............................................. H01L 21/60
[52] U.S. Cl. .................................. 437/209; 437/211; 437/214; 437/220; 357/72; 357/80
[58] Field of Search ............... 437/209, 211, 214, 216, 437/220; 357/72, 75, 80

[56] References Cited

U.S. PATENT DOCUMENTS

| | | | |
|---|---|---|---|
| 4,709,468 | 12/1987 | Wilson | 357/75 |
| 4,784,972 | 11/1988 | Hatada | 437/209 |
| 4,795,512 | 1/1989 | Nattatani et al. | 427/96 |
| 4,926,241 | 5/1990 | Carey | 357/71 |

FOREIGN PATENT DOCUMENTS 8907834  8/1989  World Int. Prop. O. .......... 437/209

Primary Examiner—Brian E. Hearn
Assistant Examiner—Kevin M. Picardat
Attorney, Agent, or Firm—Terje Gudmestad; Jeannette M. Walder; W. K. Denson-Low

[57] ABSTRACT

Interconnection of densely populated multiple chip integrated hybrid circuits (12) in a manner such that heat can be efficiently extracted therefrom. An integrated circuit die (31) is attached to a flip chip interconnect layer by soldering the connection pads thereto. The interconnect layer is slid off its substrate (11) in the manner of a decal. After the circuit has been tested and found acceptable, the other side of the die (31) is permanently bonded to a thermal conduction plate or heat sink (32). The decal interconnect (33) is made of alternating layers of an insulator (41) and a conductor (42) built on top of an erodible sacrificial layer (48) applied to a substrate. The sacrificial layer (48) is dissolved by a suitable solvent to float the multilayer interconnect off the substrate (11).

14 Claims, 1 Drawing Sheet

FLIP INTERCONNECT

BACKGROUND

The present invention relates to mounting and electrically connecting integrated circuits and, more particularly, to the packaging of an integrated circuit die in a high density multichip package.

Hybrid circuits involve a technology in which some elements are fabricated in film layers directly on a substrate material and other elements are discrete add-on-components. A typical hybrid circuit may be hermetically sealed within a protective package and may comprise a plurality of densely arranged integrated circuit chips. Several different approaches are used to make the input/output connections to the connection pads on the face of each tiny integrated circuit die.

One interconnection method is the so-called HDMI, or high density multichip interconnection, technique. In one HDMI process, the HDMI interconnect is built up layer by layer on a silicon or ceramic substrate, and the densely arranged integrated circuit chips are next bonded face-up to the HDMI substrate. Finally, the chips are connected electrically to the HDMI interconnect by wire bonding or by Tape Automated Bonding (TAB); both well known processes.

Another interconnection method is the so-called flip chip technique. One specific example of flip chip bonding is the process that is sometimes referred to as the C4 process. A flip chip is an integrated circuit die prepared for reflow face bonding by the growth of solder hemispheres on the bond pads of the chip. In the flip chip interconnection process, after the die has been prepared with solder bumps on its face, it is flipped over for attaching to a matching rigid substrate on which interconnecting thin films have previously been deposited. All connections are then made by applying heat.

Another technique for face down bonding to the bond pads is referred to as flip TRB, or testable ribbon bonding. A conductive connector ribbon having a kink for stress relief is used in place of the solder bumps. A die having the kinked ribbons is flipped over and attached to a mating rigid substrate on which interconnecting thin films have previously been deposited.

In conventional high density multichip packages, an integrated circuit die is typically mounted on a substrate made of a material that is not a good conductor of heat. Hence, the integrated circuit die is only partially cooled from the back side. Typically, the heat escapes by radiation from the cover of the package that encloses the chip and thus it is difficult to keep the package cool. As the chip density increases, it becomes more important to find ways to remove the heat from the integrated circuit package to keep the chips as cool as possible.

Accordingly, it is an objective of the present invention to provide a mounting and interconnection method that permits a direct thermal connection from an integrated circuit chip to a heat sink in a high density multichip package. Another objective of the present invention is to interconnect a flip chip die in a high density package without the strain of a rigid substrate.

SUMMARY OF THE INVENTION

In accordance with these and other objectives and features of the invention, there is provided a technique for removing the heat from one side of an integrated circuit die and making the electrical connections to the other side of the die. In this technique, the die is attached to a flip-chip interconnect layer in a conventional manner, and then the interconnect layer is slid off its substrate in the manner of a decal. The decal may have been previously removed before die attach. This results in a thin foil interconnect fastened to one side of the multiple die. After the circuit has been electrically tested and found acceptable, the other side of the die is bonded to a thermal conduction plate or heat sink. The final configuration is a face-up die on a heat sink interconnected by a "decal". Heat is then easily conducted away from the die. If desired, the heat sink may be thermally bonded to other heat sink materials and structures such as heat pipes and liquid grids. Processes other than HDMI may also be used to fabricate the "decal" which is essentially a high density flexible interconnect (having line widths of less than 3 mils). In addition, processes such as "flip TAB" and "flip TRB" processes may be used to to attach the chips to the decal. It may also be fabricated by laminating multiple layers of interconnects, without the use of a rigid substrate.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Figure 1:
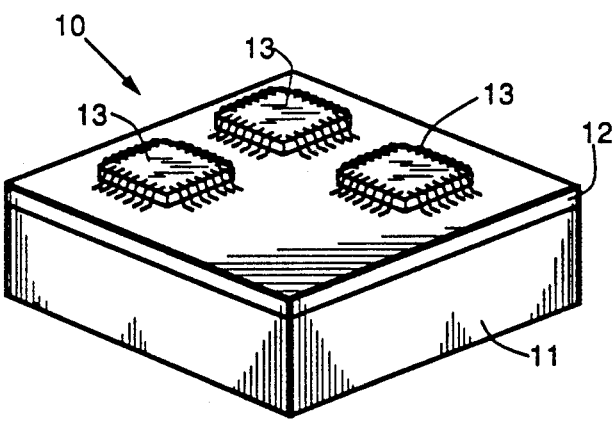
FIG. 1 is a perspective view of a conventional high density multichip interconnection (HDMI) arrangement.

Referring now to FIG. 1 of the drawings, there is shown a conventional hybrid 10 of the type that is presently used in many applications. The hybrid 10 comprises a substrate 11 which is made of a material such as silicon, or ceramic, or the like. A high density multichip interconnection (HDMI) interconnect 12 is built up on top of the substrate 11 for the purpose of making electrical connections. A plurality of densely disposed integrated circuit chips 13 are bonded face up on top of the HDMI interconnect 12. The chips 13 are electrically connected to the HDMI interconnect 12 by tab connections 14. The density employed for integrated circuit chips on hybrid circuit boards is increasing. For example, one application in a well-known super computer is known to have 240 integrated circuit chips on a single CPU board. Each chip has 284 pins on 0.011 inch centers. Collectively the 240 chips on the CPU board contain about 2.7 million gates.

Figure 2:
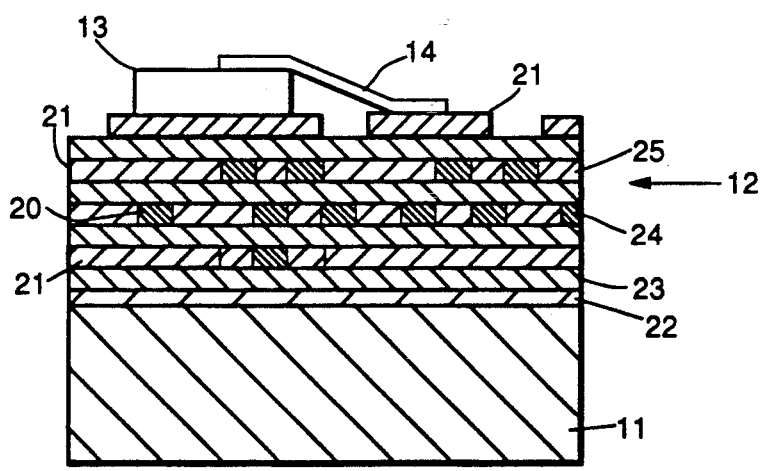
FIG. 2 is an enlarged side view of a portion of the HDMI arrangement of FIG. 1 showing the conventional interconnect method.

Referring now to FIG. 2, there is shown an enlarged cross-sectional view of the connection method illustrated in FIG. 1. FIG. 2 shows only a portion of the hybrid 10 comprising the substrate 11 having the HDMI interconnect 12 built on top thereof, with one of the integrated circuit chips 13 bonded thereto. The chip 13 is electrically connected to the HDMI interconnect 12 by a tab connection 14. It will be understood that FIG. 2 is not drawn to scale. For example, the entire HDMI interconnect 12 is on the order of 0.0025 inches thick. As may be seen in FIG. 2, the HDMI interconnect 12 is a multilayer structure comprising an insulator 20 made of a suitable material such as polyimide, or the like. Other layers are conductors 21, made of a suitable conductive material such as copper, or the like. A ground plane 22 is provided at the very bottom of the HDMI interconnect 12 adjacent the substrate 11. The HDMI interconnect 12 shown in FIG. 2 is also provided with a power plane 23, a first signal layer 24, and a second signal layer 25. In addition, the HDMI interconnect 12 includes many vias (not shown). It will be understood that the presently used HDMI interconnect 12 illustrated in FIGS. 1 and 2 is built up layer by layer using well known processes and techniques.

As was pointed out hereinbefore, in conventional high density multichip packages, an integrated circuit die is typically bonded to a material that is not a good conductor of heat. Hence, the integrated circuit die typically is only partially cooled from the back side. Instead, heat generally escapes by radiation from the cover of the package that encloses the chip. As chip density increases, it becomes more important to find ways to remove heat from integrated circuit packages and keep the chips as cool as possible. Typically, in conventional hybrids, there are many thermal interfaces between the chip and a heat sink. It is a feature of the present invention to eliminate unnecessary thermal interfaces and to efficiently remove heat from hybrid packages.

Figure 3:
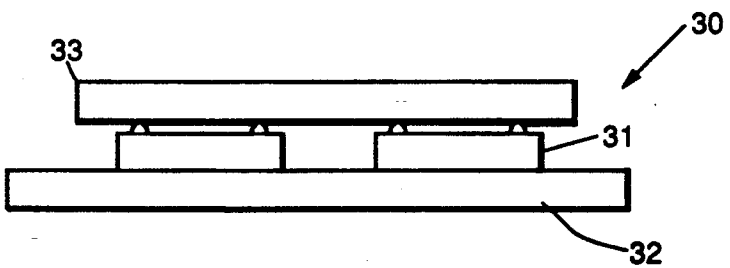
FIG. 3. shows an enlarged sectional view of a flip interconnect structure in accordance with the present invention having an active die between a decal flip interconnect and a heat sink.

Referring now to FIG. 3, there is shown a flip interconnect 30 made in accordance with the principles of the present invention. As shown in FIG. 3, the flip interconnect 30 has at least one face-up integrated circuit die 31 on a heat sink 32 interconnected by a decal interconnect 33. It will be understood that the dimensions are not to scale in the figure. For example, the decal interconnect 33 may be on the order of 0.0025 inch thick.

The flip interconnect 30 provides means for removing heat from one side of the integrated circuit die 31 and making the electrical connections to the other side of the die 31. In accordance with the principles of the present invention, the die 31 is attached to a flip-chip interconnect layer in a conventional manner, and then the interconnect layer is slid off its substrate in the manner of a decal. In addition to conventional soldering processes, processes such as "flip TAB" and "flip TRB" processes may be used to to attach the chips to the decal. This results in a thin foil decal interconnect 33 fastened to one side of the die 31. After the die 31 has been electrically tested and found acceptable, the other side of the die 31 is permanently bonded or pressed to the heat sink 32. The final configuration is a face-up die 31 on a heat sink 32 interconnected by a "decal" interconnect 33. Heat is then easily conducted away from the die 31. If desired, the heat sink 32 may be thermally bonded to other heat sink materials and structures such as heat pipes and liquid grids.

Figure 4:
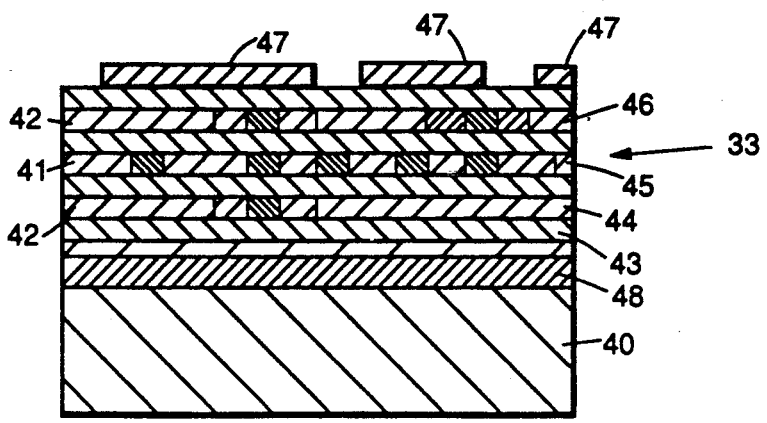
FIG. 4 is an enlarged cross-sectional view of a decal flip interconnect of the present invention built up layer by layer on a substrate.

The decal interconnect 33 may be a standard HDMI interconnect. The HDMI interconnect may be built up in the normal way on a silicon or ceramic substrate and floated off as a "decal". Referring now to FIG. 4, there is shown an examplary embodiment of a decal interconnect 33 in accordance with the invention built up on a substrate 40 made of a material such as silicon or ceramic, or the like. The decal interconnect 33 comprises one or more layers of an insulator 41 made of polyimide, or the like, and one or more layers of a conductor 42 made of aluminum or copper, or the like. In the exemplary embodiment illustrated in FIG. 4, there is provided a ground plane 43, a power plane 44, a first signal layer 45, and a second signal layer 46. The decal interconnect 33 may also include many vias (not shown). A plurality of conductive pads 47 are provided for making connection to a flip chip semiconductor die.

In order to float the decal interconnect 33 off the substrate 40, there is provided a sacrificial layer 48 disposed therebetween. Starting with the substrate 40 made of silicon or ceramic, or the like, there is first applied a sacrificial layer 48 made of a material such as titanium or tungsten, or the like. Then the aluminum/polyimide multilayer decal interconnect 33 is built on top of that foundation. A flip chip die is bonded to the decal interconnect 33 and tested electrically. After testing, the device assembly is immersed in a liquid to dissolve the sacrificial layer—in this case a 30% hydrogen peroxide mixture, and soaked until the sacrificial layer 48 of titanium or tungsten is dissolved. The hydrogen peroxide solvent does not affect the polyimide or the semiconductor device. After the decal interconnect 33 has been floated off the substrate 40, the semiconductor die is bonded or pressed to a heat sink as described in connection with FIG. 3, and then the device assembly is packaged.

The sacrificial layer 48 may be made of materials other than titanium or tungsten. It is only necessary that the sacrificial layer 48 be an erodible foundation that may be dissolved without adversely affecting the interconnect 33 or the semiconductor devices. If desired, the sacrificial layer 48 may be made of an organic thermoplastic. After the decal interconnect 33 has been built up, the assembly may be heated to melt the thermoplastic, and then the decal interconnect 33 may be peeled off the substrate 40. If desired, an organic soluble sacrificial layer 48 may be used with a solvent. For example, a silicon oxide coating may be used for the sacrificial layer 48 and it may be dissolved with hydrofluoric acid. The acid attacks the silicon oxide but does not affect the aluminum used for the conductors 42. The sacrificial layer 48 may also be made of sodium carbonate, if desired. Then the sacrificial layer 48 may be dissolved in water.

Processes other than HDMI may also be used to fabricate the "decal" which is essentially a high density flexible interconnect having line widths of less than 3 mils. It could be fabricated by lamination of layers of interconnects, without being processed on a rigid substrate.

Referring again to FIG. 3, one method of attaching the flip interconnect 30 is to flip chip the die 31 onto the decal interconnect 33 and later to detach the decal interconnect 33 and die 31 from the HDMI substrate. A second method is to detach the decal interconnect 33 first, and then flip chip the die 31. This second method might be used if the decal interconnect 33 changes size upon detachment from the HDMI substrate.

The decal interconnect 33 may be held in a frame to make it easier to handle after removal from the substrate. Typically, this is accomplished by using a vacuum. Connection between the decal interconnect 33 and the next level of interconnect may be made by a variety of methods including wire bonding or by using the so-called "gold dot" process to make a separable connection. The next level of interconnect might be, for example, to a printed circuit board or to a ring frame of a hybrid circuit package.

It is a feature of the invention that the decal interconnect 33 interconnects the "flip chip" die 31 with high density and without the strain of a rigid substrate. It allows full electrical pretesting prior to committing the structure to the heat sink 32 or to the final package. It is a principal of the present invention to bond the die 31 to the flexible complex high density interconnect 33 by a flip chip process, and support this structure by a heat sink 32. The die 31 may be held to the heat sink 32 by adhesive or pressure.

The flip interconnect 30 of the present invention has all the advantages of conventional flip chip structures: namely high density and low inductance. It preserves investment in the HDMI standard process. The stresses induced in flip chip bonds by thermal mismatch are relieved by the compliance and thermal coefficient of expansion (TCE) match of the flexible interconnect 33. The heat is directly transferred to the heat sink 32, without the interconnect 33 being a thermal barrier.

The flip interconnect 30 of the present invention is ideal for high speed, high power devices due to close packing, low dielectric constant, short line interconnects and the availability of a wide variety of heat sink materials and structures such as heat pipes, liquid grids, etc. Compared to a process which builds the interconnect on top of the die, sometimes called an "overlay" process, the present invention provides: easier rework, more options for processing the "decal" since the die does not have to be protected during the process, and simpler alignment (one die at a time). Also, the present invention provides excellent compatibility with chip on board applications since both die and substrate can be passivated or coated with a resistant material prior to package assembly to provide environmental stability.

Thermal design is enhanced and simplified by making the thermal structure planar and possibly rigid, and the electrical interconnect between one die and another is conforming. Normally the electrical interface is simplified by being planar and the thermal interface must conform, e.g. using gels or pistons, for example. The heat sink need not be planar—it could conform, for example to a fuel tank in an aircraft.

Thus there has been described a new and improved method of packaging an integrated circuit die for high density. It is to be understood that the above-described embodiment is merely illustrative of some of the many specific embodiments which represent applications of the principles of the present invention. Clearly, numerous other arrangements can be readily devised by those skilled in the art without departing from the scope of the invention.

What is claimed is:

1. A method of packaging a plurality of densely disposed integrated circuit chips comprising the following steps:

applying the connection pads of a plurality of integrated circuit chips to a decal-like multilayer interconnect, said multilayer interconnect comprising alternate layers of insulator and metal formed on a substrate and separated from said substrate by a sacrificial layer;

applying heat to said integrated circuit chips and to said interconnect to form an electrical connection therebetween;

pretesting electrically the performance of said integrated circuit chips;

dissolving said sacrificial layer with a suitable solvent;

floating the decal-like multilayer interconnect off said substrate;

bonding a heat sink to said integrated circuit chips on the side opposite the face thereof; and packaging said integrated circuit chips in a container.

2. A method of interconnecting a plurality of densely disposed integrated circuit chips comprising the following steps:

applying a sacrificial layer of an erodible substance to a substrate;

building a multilayer decal-like flexible interconnect of alternating layers of conductor and insulator on said substrate;

dissolving said sacrificial layer with a suitable solvent;

floating said flexible interconnect off said substrate;

applying the connection pads of a plurality of integrated circuit chips to said flexible interconnect;

soldering the connection pads of said integrated circuit chips to said flexible interconnect to form electrical connection therebetween;

pretesting electrically the performance of said integrated circuit chips; and bonding a heat sink to said integrated circuit chips on the side opposite the face thereof.

3. A method of making a decal-like flexible interconnect comprising the following steps:

applying a sacrificial layer of an erodible substance to a substrate;

building a multilayer interconnect of alternating insulating and conductive layers on top of said sacrificial layer;

dissolving said sacrificial layer with a suitable solvent; and floating said decal-like flexible interconnect off said substrate.

4. The method of claim 3 in which said sacrificial layer comprises titanium and said solvent comprises a 30% hydrogen peroxide mixture.

5. The method of claim 3 in which said sacrificial layer comprises tungsten and said solvent comprises a 30% hydrogen peroxide mixture.

6. The method of claim 3 in which said sacrificial layer comprises an organic thermoplastic which is heated so that the flexible interconnect may be peeled off the substrate.

7. The method of claim 3 in which said sacrificial layer comprises an organic material.

8. The method of claim 3 in which said sacrificial layer comprises silicon oxide and the solvent comprises hydrofluoric acid.

9. The method of claim 3 in which said sacrificial layer comprises sodium carbonate and said solvent comprises water.

10. The method of claim 3 in which said substrate comprises silicon.

11. The method of claim 3 in which said substrate comprises ceramic.

12. The method of claim 3 in which said insulating layer comprises polyimide.

13. The method of claim 3 in which said conductive layer comprises aluminum.

14. The method of claim 3 in which said conductive layer comprises copper.

* * * * *